(12) United States Patent
Li (10) Patent No.: US 9,964,566 B2
(45) Date of Patent: May 8, 2018

(54) POWER LINE MONITORING APPARATUS AND METHOD

(71) Applicant: The University of Manchester, Manchester (GB)

(72) Inventor: Haiyu Li, Manchester (GB)

(73) Assignee: The University of Manchester, Manchester (GB)

( * ) Notice: Subject to any disclaimer, the term of this patent is extended or adjusted under 35 U.S.C. 154(b) by 268 days.

(21) Appl. No.: 14/651,821

(22) PCT Filed: Dec. 12, 2013

(86) PCT No.: PCT/GB2013/053272
§ 371 (c)(1),
(2) Date: Jun. 12, 2015

(87) PCT Pub. No.: WO2014/091233
PCT Pub. Date: Jun. 19, 2014

(65) Prior Publication Data
US 2015/0309079 A1    Oct. 29, 2015

(30) Foreign Application Priority Data

Dec. 12, 2012 (GB) .................................. 1222362.4

(51) Int. Cl.
*G01R 15/18* (2006.01)
*G01R 3/00* (2006.01)

(52) U.S. Cl.
CPC ............ *G01R 15/181* (2013.01); *G01R 3/00* (2013.01)

(58) Field of Classification Search
CPC .. G01R 1/20; G01R 1/22; G05B 2219/37019; G05B 2219/37031; G05B 2219/37123; G05B 2219/37133

USPC ......................................................... 324/127
See application file for complete search history.

(56) References Cited

U.S. PATENT DOCUMENTS

| 4,471,355 | A | * | 9/1984 | Hardy | ..................... G01R 15/18 |
| | | | | | 324/96 |
| 4,616,176 | A | * | 10/1986 | Mercure | ............... G01R 15/181 |
| | | | | | 174/350 |
| 4,831,327 | A | * | 5/1989 | Chenier | ................ G01R 15/181 |
| | | | | | 324/126 |

(Continued)

FOREIGN PATENT DOCUMENTS

| DE | 2739599 A1 | 3/1979 |
| EP | 0130706 A1 | 1/1985 |

(Continued)

OTHER PUBLICATIONS

International Preliminary Report on Patentability dated Jun. 16, 2015, in the International application No. PCT/GB2013/053272, filed Dec. 12, 2013, 9 pages.

(Continued)

*Primary Examiner* — Tung X Nguyen
*Assistant Examiner* — Dominic Hawkins
(74) *Attorney, Agent, or Firm* — Wilmer Cutler Pickering Hale and Dorr LLP (57) ABSTRACT

Devices and methods for measuring an electrical characteristic, in particular, for measuring current are provided. The devices can use a pair of MEMS optical modulators as opposed to the more conventional coil and associated oil insulation arrangement.

8 Claims, 6 Drawing Sheets

(56) References Cited

U.S. PATENT DOCUMENTS

| | | | | |
|---|---|---|---|---|
| 4,847,780 | A * | 7/1989 | Gilker | G01R 15/186 324/127 |
| 5,012,182 | A * | 4/1991 | Fujiki | G01R 15/242 174/139 |
| 5,546,218 | A * | 8/1996 | Komatsubara | G02F 1/0121 359/237 |
| 5,706,117 | A * | 1/1998 | Imai | G02F 1/0123 372/29.02 |
| 6,670,799 | B1 * | 12/2003 | Bull | G01R 15/181 324/127 |
| 8,873,125 | B2 * | 10/2014 | Saadany | G01B 7/08 250/458.1 |
| 2005/0270013 | A1 * | 12/2005 | Berkcan | G01R 33/0283 324/126 |
| 2013/0063066 | A1 * | 3/2013 | Fish | H02K 11/001 318/490 |
| 2013/0335730 | A1 * | 12/2013 | Shan | G01R 15/241 356/72 |

FOREIGN PATENT DOCUMENTS

| | | |
|---|---|---|
| EP | 0849600 A1 | 6/1998 |
| GB | 1125676 A | 8/1968 |
| GB | 2400172 A | 10/2004 |
| GB | 2508843 A | 6/2014 |
| WO | WO-99/42844 A1 | 8/1999 |

OTHER PUBLICATIONS

United Kingdom Search Report dated Jan. 21, 2016, in application No. GB1513590.8, 3 pages.

International Search Report and Written Opinion issued by the European Patent Office as International Searching Authority for International Application No. PCT/GB2013/053272 dated Mar. 20, 2014 (10 pages).

Search Report completed on May 28, 2013, in United Kingdom application No. GB 1222362.4, 1 page.

* cited by examiner

POWER LINE MONITORING APPARATUS AND METHOD

This application is a U.S. National Stage application under 35 U.S.C. § 371 of International Patent Application No. PCT/GB2013/053272, filed Dec. 12, 2013, and claims priority to GB Application 1222362.4, filed Dec. 12, 2012.

FIELD OF THE INVENTION

Embodiments of the present invention relate to devices and methods; and, more particularly, to devices and methods for measuring current.

BACKGROUND TO THE INVENTION

AC current measurement in the electric power industry has been traditionally carried out using transformers; voltage transformers and current transformers. In high-voltage environments, for example, when the line voltage is or is greater than 33 kV such as, for example, 400 kV, electrical insulation is difficult at least in part due to the safety performance requirements of magnetic core based current sensors, which can carry thousands of amps in its primary and 1A/5A of normal current in its secondary. The current sensors can sustain large fault currents of the order of about 20 to 30 times the normal currents for a sufficiently short period to allow power system protection equipment to trip circuit breakers for the faulty line. Furthermore, significant insulation, in the form of oil, is needed for such current transformers. Consequently, current transformers for such environments are bulky and expensive. However, any moisture/small gas bubble accumulations in the current transformer can lead to a catastrophic failure such as, for example, an explosion.

It is well-known to use optical current sensors or optical transformers within such high-voltage environments. These products are based on the Faraday rotation effect within optical fibres or within a bulk optical material in which the polarisation of an optical signal is affected by the magnetic field associated with an electric current carried by a conductor. Changes in polarisation are detected by an optical receiver. However, such products suffer from the disadvantages that the Faraday rotation effect is, firstly, relatively weak and, secondly, that detecting changes in polarisation is relatively difficult since polarisation within optical materials varies significantly with environmental conditions. Other environmental conditions such as, for example, the vibrations caused by weather, also adversely affect the performance of such optical current sensors. Still further, to compensate for instability, relatively large optical current transformers are required.

UK patent GB 2400172 B discloses an optical AC current sensor that is based upon an electro-optic amplitude modulator having a modulation depth that has fixed relationship with the driving voltage. The driving voltage is derived from an AC current or voltage under measurement. In operation, optical power from an optical source is modulated by the driving voltage, the modulation depth has a fixed relationship with the driving voltage and the modulated optical signal is detected by the optical receiver. In preferred embodiments, the electro-optic amplitude modulator is insensitive to polarisation variations due to using a diffractive MEMS based variable optical attenuator. Most types of electro-optical amplitude modulators or variable optical attenuators, including diffractive MEMS based variable optical attenuators, require a DC bias voltage to be able to change optical attenuation in both positive and negative directions. One skilled in the art will appreciate that such an active arrangement consumes power by requiring a separate circuit to provide a biasing voltage.

It is an object of embodiments of the present invention to at least mitigate one or more problems of the prior art.

SUMMARY OF INVENTION

Accordingly, embodiments of the present invention provide a current transformer responsive to a current carried, at a respective voltage, by a conductor; the current transformer comprising a circuit having at least one optical modulator for providing a modulated optical output that varies with current variation of the current; the circuit comprising a voltage reference line for coupling to the conductor to bias the circuit using the respective voltage.

Advantageously, devices according to embodiments of the present invention provide a passive solution that is stable, extremely reliable and that does not require a separate biasing circuit to derive a respective biasing voltage.

Embodiments also provide a method of installing a current transformer or assembly having a current transducer, the method comprising electrically coupling the current transducer to a respective conductor.

BRIEF DESCRIPTION OF THE DRAWINGS

Embodiments of the present invention will now be described, by way of example only, with reference to the accompanying drawings in which.

DETAILED DESCRIPTION OF EMBODIMENTS

Figure 1:
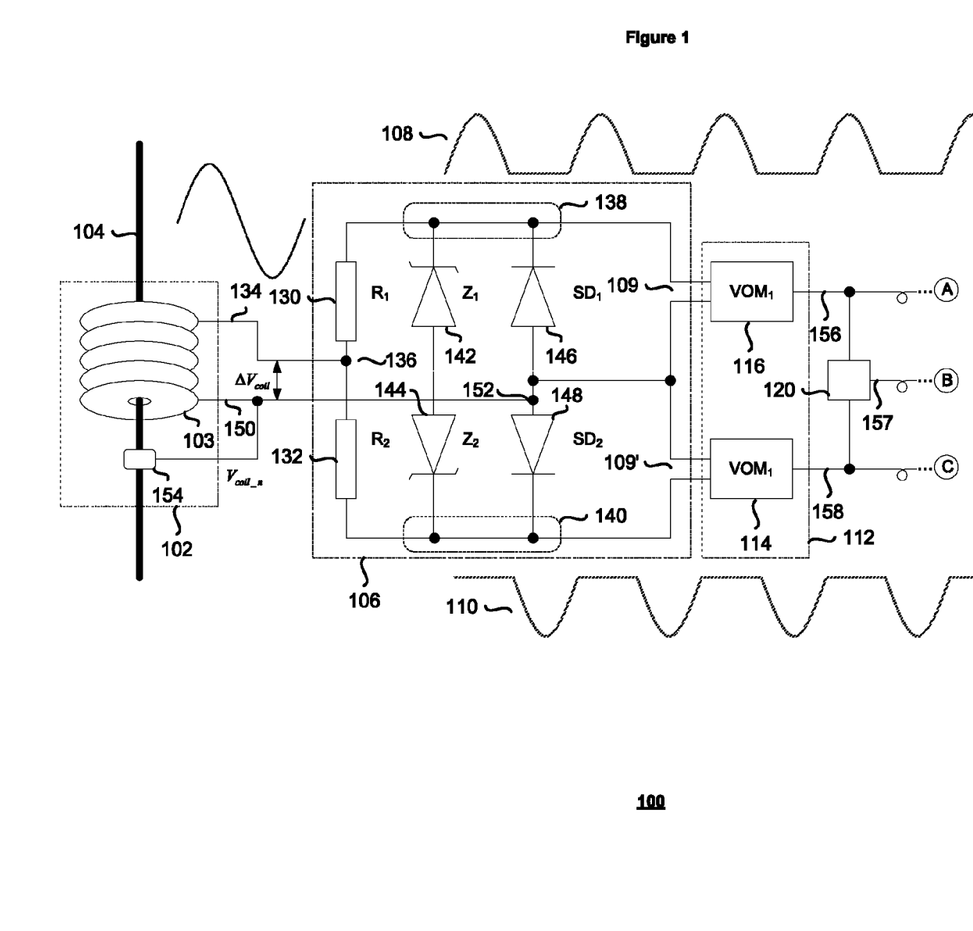
FIG. 1 shows an embodiment of a current transformer.

Referring to FIG. 1, there is shown a current transformer 100 according to an embodiment. The current transformer 100 comprises transducer 102 for outputting a voltage, $\Delta V_{coil}$, associated with the current flowing in a conductor 104. The conductor 104 may be a busbar. The current transformer 100 also comprises a passive circuit 106 for receiving the output voltage $\Delta V_{coil}$ and a reference or biasing voltage $V_{coil\_}{}^n$ and for producing half-wave rectified waveforms 108 and 110 therefrom at two pairs of output terminals 109 and 109'. In the illustrated embodiment, it can be appreciated that $\Delta V_{coil}$ varies sinusoidally. The half-wave rectified waveforms 108 and 110 are fed to an optical modulator 112. The optical modulator 112 is arranged to produce an optical output that is responsive to the half-wave rectified waveforms 108 and 110. Preferred embodiments of the present invention use MEMS optical modulators such as the pair 114 and 116 of optical modulators illustrated in FIG. 1.

Figure 2:
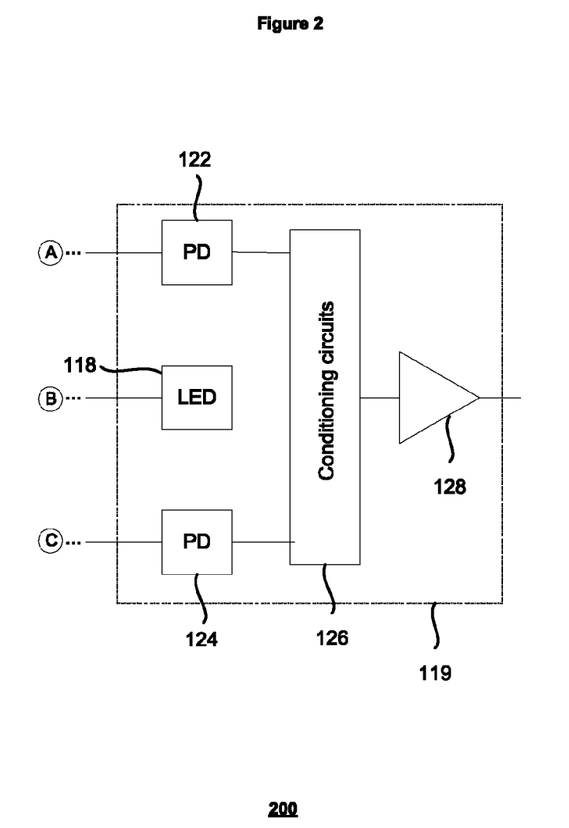
FIG. 2 shows an embodiment of optical modulators.

Referring to FIG. 2, light for the optical modulators is provided by a light source 118 of an optical transceiver 119. Light from the light source 118 is split by a light splitter 120 and fed to respective voltage optical modulators 114 and 116. The modulated light output by the modulators 114 and 116 is detected by respective light detectors that, in the present example, are realised using a pair 122 and 124 of photodetectors such as, for example, a pair of photodiodes. Preferably, a conditioning circuit 126 is provided to process the outputs of the photodetectors to produce a signal indicative of the current carried by the conductor 104. Preferably an amplifier 128 is used to amplify the indicative signal. Embodiments of the optical modulators 114 and 116 can be realised using optical attenuators such as, for example, mems mirrors having a deflection that is associated with an applied signal such as the voltages across one or more of the inputs to the VOMs 114 and 116.

Preferably, the transducer 102 is realised using a Rogowski coil 103 having two outputs.

The passive circuit 106, in a preferred embodiment, comprises a voltage divider realised using first and second resistors 130 and 132. A first output 134 of the Rogowski coil is coupled to a central node 136 of the voltage divider. The other end of the first resistor 130 is connected to a respective upper node 138 whereas the other end of the second resistor 132 is connected to a respective lower node 140. A surge protection arrangement limits the voltage swings between the upper 138 and lower 140 nodes. Preferred embodiments realise the surge protection arrangement using a pair of back-to-back Zener diodes 142 and 144. A rectifier, preferably formed using a pair of back-to-back Schottky diodes 146 and 148, is arranged to produce the half-wave rectified waveforms 108 and 110. The other output 150 from the Rogowski coil 103 is coupled to a central node 152 between the back-to-back Schottky diodes 146 and 148. The other ends of the Schottky diodes 146 and 148 are coupled to the upper 138 and lower 140 notes respectively.

A reference or neutral voltage $V_{coil\_}"$ is derived directly from the conductor 104 via a suitable coupling 154. The reference voltage is coupled to the central node 152 to provide a biasing, that is, to provide a voltage about which the output from the Rogowski coil 103 can swing.

The central node 152 and the upper node 138 form a first pair 109 of outputs from the passive circuit 106. The first pair of outputs is used as inputs to the first voltage optical modulator 116. The central node 152 and the lower node 140 form a second pair 109' of outputs from the passive circuit 106. The second pair of outputs is used as inputs to the second voltage optical modulator 114.

Preferred embodiments of the voltage optical modulators 114 and 116 are realised using MEMS mirrors having deflections associated with input voltages appearing across their inputs. Referring to FIG. 2, it can be appreciated that the voltage optical modulators 114 and 116 receive light, output by a light source 118, via respective fibre optics 156 and 158, a light splitter 120 and a respective feed fibre 157. Light is reflected by the MEMS mirrors back along the fibre optics 156 and 158 where it is detected by the photodetector or photo diodes 122 and 124.

A conditioning circuit 126 is arranged to combine the two waveforms 108 and 110 into a single waveform. In a preferred embodiment, the single waveform is a sinusoidal waveform.

It will be appreciated that installing a current transformer according to an embodiment of the invention will require an engineer to derive the reference or biasing voltage directly from transmission line. Therefore, a couple 154 is used to form a direct electrical connection between the conductor 104 and the passive circuit 106. Embodiments realise the foregoing by providing a direct electrical connection to an output of the current transducer, such as, for example, the Rogowski coil. Suitably, embodiments of the present invention provide current transducer, such as, for example, a Rogowski coil, comprising a pair of outputs for providing a voltage to the passive circuit, and a means of electrically coupling the current transducer, such as, for example, the Rogowski coil, to the transmission line to derive a reference voltage.

Embodiments provide a method of installing a current transformer comprising the step of installing a current transducer about a conductor; and coupling an output of the current transducer to the conductor to provide a biasing voltage to a circuit for driving at least one optical modulator or coupling an input of a circuit, for driving at least one optical modulator, to the conductor to derive a biasing voltage therefrom. It will be appreciated that the biasing voltage will be the same as the voltage of the line or conductor 104.

Figure 3:
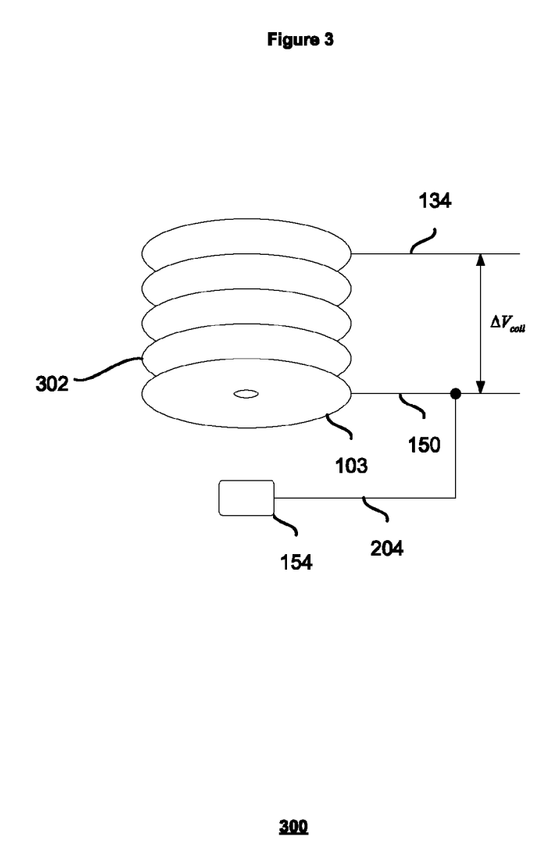
FIG. 3 depicts a first embodiment of a Rogowski coil.

Referring to FIG. 3, there is shown a view 300 of a Rogowski coil 103 according to an embodiment comprising windings 302 having a first output 134 and a second output 150 for providing a voltage $\Delta V_{coil}$ associate with the flux of a conductor (not shown). The Rogowski coil 103 also comprises an input 204 having the couple 154 at a free end thereof. Although the embodiment of the Rogowski coil 103 is shown as having a separate electrical connector for coupling to the conductor, alternative embodiments can be realised. For example, a conductive cap at one end of the coil, or conductive caps at both ends of the coil, can be integrally formed with the coil to provide a unitary structure for driving the biasing voltage from the conductor. It will be appreciated that the caps will be electrically connected to the passive circuit or to an output of the current transducer 102 intended for coupling to the passive circuit to provide the biasing voltage.

Figure 4:
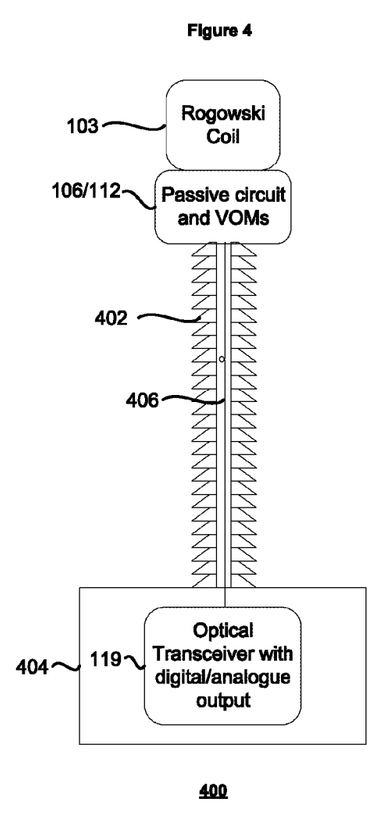
FIG. 4 shows a current transformer assembly according to an embodiment.

Referring to FIG. 4 there is shown an embodiment of a current transformer assembly 400 according to an embodiment. The assembly comprises a Rogowski coil 103 coupled to the passive circuit 106 and optical modulator 112, which are supported by an insulating tower 402. The insulating tower 402 is mounted on a mount 404. The mount 404 can house electro-optical equipment for communicating with a monitoring station (not shown). The electro-optical equipment can comprise the optical transceiver 119. The electro-optical equipment can also comprise communication electronics compliant with, for example, IEC61850-9-2 to support digital communications between substations and monitoring equipment. It can be appreciated that the insulating tower 402 is hollow and houses the fibre optic cables referred to above, but referenced collectively as 406 in FIG. 4. Embodiments of the present invention, in the form of such an assembly 400, can be pre-fabricated at a site that is remote from a substation or the like where the assembly will be installed, which facilitates ease of installation at the substation or the like. The current transducer 102 is coupled to a busbar at the substation or the like.

Although embodiments of the invention have been described with reference to the output of the current transformer assembly being digital, embodiments are not limited to such an arrangement. Embodiments can be realised in which the output is an analogue signal. The analogue signal can be applied to a relay that actuates a circuit breaker that is in-line, at least electrically, with the conductor such that opening the circuit breaker prevents current flow within the conductor. Similarly, embodiments using the digital communications described above can forward data relating to the current in the conductor to a merging unit. The merging unit can then take appropriate action such as, for example, actuating a circuit breaker to prevent current flow within the conductor.

Embodiments of the invention comprise a method of installing a current transformer 100 or assembly 400 having a current transducer 102 as described herein. The method comprises electrically coupling the current transducer 102 to the conductor 104. One skilled in the art will appreciate that an embodiment of the present invention is provided per phase to be monitored.

Figure 5:
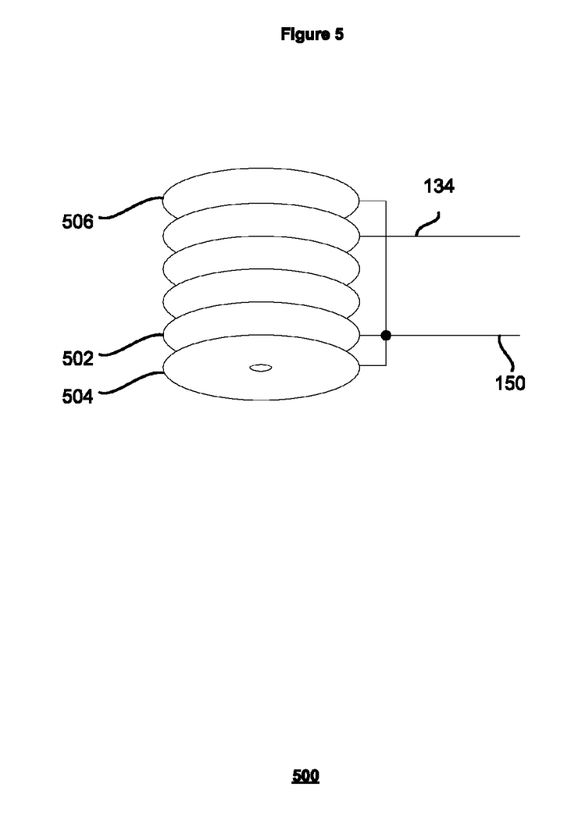
FIG. 5 illustrates a second embodiment of a Rogowski coil.

Referring to FIG. 5, there is shown a current transducer 500 according to an embodiment. The current transducer comprises a Rogowski coil 502 having a pair 504 and 506 of conductive end caps arranged, in used, to be in electrical connection with a conductor 104. The conductive caps 504 and 506 are both coupled to an output line of the coil, such as, for example, line 150.

Figure 6:
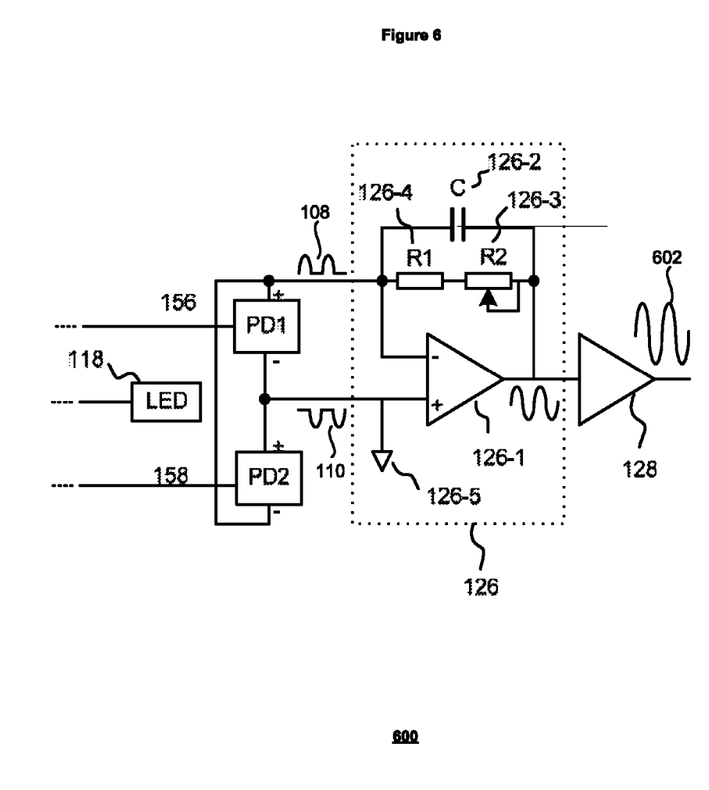
FIG. 6 shows an embodiment of a conditioning circuit.

Referring to FIG. 6, there is shown a view 600 of an embodiment of a conditioning circuit 126. The conditioning circuit 126 comprises an op-amp 126-1 configured as an adder to add together the two waveforms 108 and 110 to produce a combined waveform 602. Embodiments can be realised in which a characteristic of the combined waveform 602 is associated with a characteristic of the current 104. The combined waveform can have an amplitude that is proportional to the current 104. However, other characteristics could equally well be used as alternatives to amplitude. The conditioning circuit can use a capacity or 126-2 in parallel with a resistance. The resistance is used to scale the two waveforms 108 and 110 relative to one another to achieve a desire proportion between the two waveforms in the combined waveform 602. Preferred embodiments achieve balance, that is, a 1:1 proportion. In the embodiment shown, the resistance is realised using a series arrangement of two resistors 126-3 and 126-4. One of the resistors, such as, for example, 126-3 can be a variable resistor, which facilitates achieving a desired proportion. It can be seen that the positive input of the op-amp 126-1 is earthed via terminal 126-5.

Although embodiments of the invention have been described with reference to the conductor 104 being a busbar, they are not limited thereto. Embodiments can be realised in which the conductor is a conductive entity other than a busbar.

Furthermore, although embodiments of the present invention have been described within the context of monitoring current within a power distribution system, embodiments are not limited thereto. Embodiments can be realised for monitoring currents in other conductors such as those supplying heavy motors or furnaces.

The invention claimed is:

1. A current transformer responsive to a current carried, at a respective voltage, by a conductor; the current transformer comprising:
   a rectifying arrangement adapted to produce a pair of rectified waveforms from a voltage variation derived from a current variation of said current carried by said conductor; said voltage variation being derived from a Rogowski coil associated with the conductor; and
   a circuit for providing a modulated optical output that varies with current variation of the current via a pair of optical modulators, and a pair of photodetectors arranged to detect an output of the optical modulators, the circuit comprising a voltage reference line for coupling to the conductor to bias the circuit using the respective voltage;
   wherein a first of the optical modulators is arranged to provide an output that varies with the voltage variation of a first of the rectified waveforms and a second of the optical modulators is arranged to provide an output that varies with the voltage variation of a second of the rectified waveforms.

2. The current transformer as claimed in claim 1, wherein the rectifying arrangement comprises a pair of resistors in parallel with at least a pair of diodes arranged, in use, to be operationally biased oppositely to produce two driving waveforms for driving the first and second optical modulators adapted to have an output that varies with the driving voltages.

3. The current transformer as claimed in claim 1, wherein the pair of optical modulators comprises MEMS mirrors adapted to deflect received light to produce the output that varies with the driving voltages.

4. The current transformer as claimed in claim 1, wherein the circuit comprises upper and lower nodes having a voltage divider, a voltage clamp or clipper and with the rectifying arrangement spanning the upper and lower nodes.

5. The current transformer as claimed in claim 4, wherein the rectifying circuit is biased using the voltage line reference.

6. The current transformer as claimed in claim 1, further comprising a conditioning circuit for producing an output waveform associated with the current.

7. A method of installing a current transformer; the method comprising:
   installing the current transformer as claimed in claim 1 about a conductor; and
   coupling the voltage reference line of the current transformer to the conductor to provide a biasing voltage to the circuit for driving the pair of optical modulators.

8. A current transformer assembly comprising the current transformer as claimed in claim 1, mounted on an insulating tower for separating the current transformer from a mount.

* * * * *